(12) United States Patent
Gruner et al.

(10) Patent No.: US 12,206,372 B2
(45) Date of Patent: Jan. 21, 2025

(54) RADIO FREQUENCY GENERATOR

(71) Applicant: COMET AG, Flamatt (CH)

(72) Inventors: Daniel Gruner, Müllheim (DE); André Grede, Bern (CH); Nikolai Schwerg, Bern (CH); Anton Labanc, Ehrenkirchen (DE); Manuel vor dem Brocke, Bramsche (DE); Roland Schlierf, Frechen (DE)

(73) Assignee: COMET AG, Flamatt (CH)

( * ) Notice: Subject to any disclaimer, the term of this patent is extended or adjusted under 35 U.S.C. 154(b) by 485 days.

(21) Appl. No.: 17/611,224

(22) PCT Filed: May 22, 2020

(86) PCT No.: PCT/EP2020/064279
§ 371 (c)(1),
(2) Date: Nov. 15, 2021

(87) PCT Pub. No.: WO2020/234453
PCT Pub. Date: Nov. 26, 2020

(65) Prior Publication Data
US 2022/0216838 A1    Jul. 7, 2022

(30) Foreign Application Priority Data
May 23, 2019   (GB) ..................... 1907306

(51) Int. Cl.
*H03F 3/24*       (2006.01)
*H01J 37/32*      (2006.01)
(Continued)

(52) U.S. Cl.
CPC ........ *H03F 3/245* (2013.01); *H01J 37/32165* (2013.01); *H01J 37/32174* (2013.01);
(Continued)

(58) Field of Classification Search
CPC ........ H03F 3/245; H03F 1/0211; H03F 3/195; H03F 2200/451; H01J 37/32165;
(Continued)

(56) References Cited

U.S. PATENT DOCUMENTS 7,179,754 B2   2/2007   Kraus et al.
8,040,068 B2  10/2011   Coumou et al.
(Continued)

FOREIGN PATENT DOCUMENTS

CN   101801153 A   8/2010
CN   102859637 A   1/2013
(Continued)

OTHER PUBLICATIONS

Franek et al., "Power Supply and Impedance Matching to Drive Technological Radio-Frequency Plasmas with Customized Voltage Waveforms", Review of Scientific Instruments, 2015, pp. 053504-1-053504-9, vol. 86, doi 10.1063/1.4921399.

*Primary Examiner* — Hieu P Nguyen
(74) *Attorney, Agent, or Firm* — The Webb Law Firm

(57) ABSTRACT

A radio-frequency generator, including a power amplifier module including a power amplifier, a pickup module connected to an output of the power amplifier to generate a pickup signal, and an output configured to be connected to the respective output of the amplifier and configured to output a radio-frequency output signal. The radio-frequency generator includes a measurement module configured to receive the pickup signal and to generate a measurement signal based on the one pickup signal; and a radio-frequency signal generation module configured to generate two or more carrier signals of different frequency, and to provide a drive signal as input to the power amplifier module, and a regulation module configured to receive the measurement
(Continued)

signal, and to regulate the power of the radio-frequency output signal based on the measurement signal.

25 Claims, 5 Drawing Sheets

(51) Int. Cl.
    *H03F 1/02*     (2006.01)
    *H03F 3/195*     (2006.01)

(52) U.S. Cl.
    CPC .... *H01J 37/32944* (2013.01); *H01J 37/3299* (2013.01); *H03F 1/0211* (2013.01); *H03F 3/195* (2013.01); *H03F 2200/451* (2013.01)

(58) Field of Classification Search
    CPC ........... H01J 37/32174; H01J 37/32944; H01J 37/3299; H01J 37/32082; H05H 1/46
    USPC .............................................. 330/295, 124 R
    See application file for complete search history.

(56) References Cited

U.S. PATENT DOCUMENTS

| | | | |
|---|---|---|---|
| 8,952,765 | B2 | 2/2015 | Fisk, II et al. |
| 9,263,236 | B2 | 2/2016 | Scullin et al. |
| 10,026,593 | B2 * | 7/2018 | Alt ...................... H01L 29/7835 |
| 10,192,721 | B2 | 1/2019 | Kasai |
| 10,431,437 | B2 | 10/2019 | Gapinksi et al. |
| 2006/0031273 | A1 | 2/2006 | Drummond |
| 2008/0251207 | A1 | 10/2008 | Chen et al. |
| 2010/0194195 | A1 | 8/2010 | Coumou et al. |
| 2010/0224321 | A1 | 9/2010 | Grimbergen et al. |
| 2011/0241773 | A1 | 10/2011 | Fisk et al. |
| 2013/0214682 | A1 | 8/2013 | Valcore, Jr. et al. |
| 2014/0320013 | A1 | 10/2014 | Coumou et al. |
| 2016/0295677 | A1 | 10/2016 | Leeser |
| 2017/0062186 | A1 | 3/2017 | Coumou et al. |
| 2017/0117869 | A1 | 4/2017 | Leeser et al. |
| 2018/0033921 | A1 | 2/2018 | Baur et al. |

FOREIGN PATENT DOCUMENTS

| | | |
|---|---|---|
| CN | 103327724 A | 9/2013 |
| JP | 2010219026 A | 9/2010 |
| JP | 2011216369 A | 10/2011 |
| JP | 2013528969 A | 7/2013 |
| JP | 2015043421 A | 3/2015 |
| JP | 2016163301 A | 9/2016 |
| JP | 2017539066 A | 12/2017 |
| KR | 1020060014424 A | 2/2006 |
| KR | 1020100090213 A | 8/2010 |
| WO | 2004064460 A1 | 7/2004 |
| WO | 2016093269 A1 | 6/2016 |

\* cited by examiner

RADIO FREQUENCY GENERATOR

CROSS-REFERENCE TO RELATED APPLICATIONS

This application is the United States national phase of International Application No. PCT/EP2020/064279 filed May 22, 2020, and claims priority to United Kingdom Patent Application No. 1907306.3 filed May 23, 2019, the disclosures of which are hereby incorporated by reference in their entirety.

BACKGROUND OF THE DISCLOSURE

The present disclosure relates generally to a radio-frequency generator, and a plasma processing system comprising the radio-frequency generator. Also disclosed is a method for operating a generator controller, and an associated computer program element, and a computer readable medium.

DESCRIPTION OF RELATED ART

High-power radio-frequency (RF) generators are well-known and are used for example in semiconductor plasma processing applications. The power provided by the generators is used, for example to ionize a processing gas in a vacuum chamber and with the resulting plasma, various processing steps for semiconductor fabrication can be performed.

Radio-frequency generators are useful for providing power to a variety of applications including semiconductor manufacturing tools (e.g. deposition, etching and modification of thin films with plasma), but also medical devices (e.g. electrosurgical devices and medical imaging machines such as magnetic resonance imaging, MRI, machines), food packaging, industrial surface modifications and coatings. Generators that produce radio-frequency power are useful in each of the aforementioned applications. Herein, the term radio-frequency designates any frequency in the range 20 kilohertz to 300 Gigahertz.

The article "Power supply and impedance matching to drive technological radio-frequency plasmas with customized voltage waveforms" (Franek et. al, AIP Review of Scientific Instruments 86, 053504 (2015); doi 10.1063/1.4921399) discusses a multi-frequency RF power supply and impedance matching for three consecutive harmonics, for example. This enables a plasma to be created using a multi-band RF signal.

US 2008/0251207 A1 discusses an RF generator for a plasma manufacturing system having a plurality of RF signal generators controlled by a controller. The outputs of the RF signal generators are combined. The combined RF signals are subjected to filtering prior to application to a plasma process chamber. Activating or deactivating each of the RF signal generators enables control of the waveform applied to the plasma process chamber.

US 2013/0214682 A1 discusses a method of tuning a multi RF generator system. In particular, low and high frequency RF generators are tuned over a relatively long time period during a "learning" phase. During a manufacturing phase, the parameters learned during the learning phase can be used to accurately set the operating frequencies of the low and high frequency RF generators during manufacturing at a much higher speed than would be possible without the learning phase.

US 2014/0320013 A1 discusses an RF generator for a plasma etch system in which two standalone RF power supplies are frequency and phase controlled in a master/slave mode.

However, the systems described in the aforementioned documents can be further improved.

Accordingly, it is desirable to provide an RF generator control approach that can more efficiently control multiple RF frequencies. Furthermore, other desirable features and characteristics of the present disclosure will become apparent from the subsequent detailed description of the disclosure and the appended claims, taken in conjunction with the accompanying drawings and the background of the disclosure.

SUMMARY OF THE DISCLOSURE

According to a first aspect, there is provided a radio-frequency generator, comprising:

a power amplifier module comprising at least one power amplifier, at least one pickup module connected to an output of the at least one power amplifier to generate at least one pickup signal, at least one output configured to be connected to the respective output of the at least one amplifier and configured to output at least one radio-frequency output signal; and a controller.

The controller comprises a measurement module configured to receive the at least one pickup signal and to generate at least one measurement signal based on the at least one pickup signal; and a radio-frequency signal generation module configured to generate two or more carrier signals of different frequency, and to provide at least one drive signal as input to the power amplifier module, and a regulation module configured to receive the at least one measurement signal, and to regulate the power of the at least one radio-frequency output signal based on the at least one measurement signal.

Accordingly, a multi-frequency RF power output to an end use may be provided using a single controller of a generator, rather than multiple controllers distributed across standalone generator units (standalone means that a generator is provided as a separate unit in an independent chassis, with independent power supply, external interface, and control arrangements for example). This enables a reduction in the cost of an RF generator, because duplicate AC circuits (to generate DC supply voltages to the amplifier module from the AC main supply), external communication interfaces, and enclosures are avoided.

Furthermore, common control of multiple frequencies of RF power inside the same RF generator means that multiple signals that would need to be synchronized can be synchronized quickly and efficiently. This has advantages for example with signals requiring a fast feedback loop (for example, for arc suppression or other fault condition suppression affecting the output power). As will be explained later, the advantages mainly result from quicker communication protocols than when using standalone generators. Previously, standalone RF generators providing multiple frequencies have been controlled by, for example, a "PROFIBUS" (™) interface, but the communication latency of such a protocol means that arc control or other faults that can appear in high frequency applications cannot be counteracted fast enough.

Preferably, the regulation module is configured to regulate the power of the at least one radio-frequency output signal by adjusting the amplitude and/or phase of at least one of the two or more carrier signals based on the at least one measurement signal.

Accordingly, a single controller can provide more accurate and when required, synchronized signal control, because signals at different frequencies are generated by the same controller.

Preferably, the power amplifier module further comprises at least a second power amplifier.

Preferably, two or more power amplifiers are configured to be operated with a common DC supply voltage.

Accordingly, generating the necessary DC supply voltage from the AC mains is less complicated than when generating several DC supply voltages.

Preferably, two or more power amplifiers are configured to be operated with separate DC supply voltages.

Accordingly, one can supply each of the power amplifiers with higher or lower DC supply voltages. This allows extra control on the output power of each power amplifiers of the radio-frequency generator.

Preferably, the regulation module is configured to operate with at least two independent regulation loops.

Preferably, the controller is configured to adjust a DC supply voltage of the at least one power amplifier based on the at least one measurement signal from the regulation module.

Preferably, at least one power amplifier is a broadband power amplifier, and the radio-frequency signal generation module is further configured to generate the two or more carrier signals as a multiple carrier drive signal.

Preferably, at least one power amplifier is a multiband power amplifier, and the radio-frequency signal generation module is further configured to generate the two or more carrier signals as a multiple-carrier drive signal.

Preferably, the power amplifier module, the at least one pickup module and the controller are implemented within a common enclosure.

Preferably, the radio-frequency generator comprises a first enclosure comprising a first of at least two power amplifiers and a second enclosure physically separate from the first enclosure comprising a second of at least two power amplifiers.

Preferably, the number of carrier signals generated in the radio-frequency signal generation module corresponds to the number of outputs of the radio-frequency generator.

Preferably, the number of carrier signals generated in the radio-frequency signal generation module corresponds to the number of outputs of pickup modules.

Preferably, the number of carrier signals generated in the radio-frequency signal generation module corresponds to the number of power amplifiers in the power amplifier module.

Preferably, the radio-frequency generation module further comprises an external interface for synchronization of the radio-frequency output power with other generators which can include one or several of other radio-frequency generators or DC generators or medium frequency generators.

Accordingly, various signals can be synchronized in phase, frequency or power.

Preferably, the radio-frequency generator further comprises a common AC input circuit.

Preferably, the radio-frequency generator has an output signal of at least 100 W.

Preferably, the radio-frequency generator has an output signal of at least 200 W.

Preferably, the radio-frequency generator has an output signal of at least 250 W.

Preferably, a radio-frequency output signal has a frequency in the range 0.1 MHz to 200 MHz, preferably in the range 1 MHz to 100 MHz, and more preferably in the range 5 MHz to 85 MHz.

Preferably, the radio-frequency generator is suitable to output power to a plasma processing system.

Preferably, the controller is configured to detect a fault event in at least one of the RF outputs, and to adjust one or more RF output signals based on the detection of the fault event.

Preferably, the fault event is an arc event in a plasma system.

According to a second aspect, there is provided a plasma processing system comprising a radio-frequency generator according to the previous aspect, or its embodiments, and a semiconductor processing tool configured to receive an RF signal from the generator.

According to a third aspect, there is provided a method for operating a radio-frequency generator and/or an RF generator controller, comprising:

Generating at least two carrier signals of different frequency using a radio-frequency generation module and providing at least one drive signal for a power amplifier module;

Measuring at least one radio-frequency output signal, using a measurement module of the controller configured to receive at least one pickup signal from at least one pickup module and generating at least one measurement signal based on the at least one pickup signal;

Regulating the power of at least one radio-frequency output signal, using a regulation module configured to receive the at least one measurement signal from the measurement module.

According to a fourth aspect, there is provided a computer program element comprising instructions which, when executed by a processor, carry out the method of the third aspect.

According to a fifth aspect, there is provided a computer readable medium comprising the computer program element of the fourth aspect.

Typically a power amplifier is optimized to be operated at or near a target operating frequency. At or near this frequency, the efficiency of the power amplifier will be optimized. Such a target operating frequency may be, for example, 2 MHz, or 6.78 MHz, or 13.56 MHz, or 27.12 MHz, or 40.68 MHz or any other frequency depending on the precise application of the RF generator comprising the power amplifier. Because the efficiency of a power amplifier diminishes when operating at frequencies away from the target operating frequency, a power amplifier is by default (that is without taking appropriate design measures to have it otherwise) a "narrowband power amplifier". It is however advantageous for some applications to have power amplifiers whose efficiency does not drop off significantly over a wide frequency range. Such a power amplifier is referred to as a "broadband power amplifier". For example, it may be advantageous to operate a power amplifier in a frequency range from 10.2 MHz to 16.8 MHz without a significant drop in efficiency in this entire frequency range. For yet other applications it can be advantageous to have a power amplifier that is operable with good efficiency at two or more frequencies while most of the frequency range between the frequencies is less relevant. For example it can be desirable to have a power amplifier with good efficiency near 13.56 MHz and also near 2 MHz and also near 40.68 MHz, but with no particular efficiency requirement at 10.2 MHz nor at 16.8 MHz for example.

In the following application, the term "broadband power amplifier" is understood to refer to an RF power amplifier which is operated across a relative bandwidth equal or greater than 40%, wherein the relative bandwidth is defined as the frequency range (normalized to the center frequency) in which the efficiency drop at nominal power is less than 10%.

In the following application, the term "multiband power amplifier" is understood to refer to an RF power amplifier which is operated at two or more frequencies simultaneously wherein the ratio between at least two of the frequency values exceeds 1.2.

In the following application, the term "drive signal" refers to a signal which is driving a power amplifier. Therefore, the drive signal is a small (low power) signal provided to a power amplifier in order to be amplified to a higher power signal with essentially the same frequency spectrum. Such a drive signal can be a single carrier signal (with single frequency component) or a multi-carrier signal (with distinct multiple frequency components). Therefore a drive signal can be composed of either one or multiple (arithmetic combinations of) carrier signals.

BRIEF DESCRIPTION OF THE DRAWINGS

The present disclosure will hereinafter be described in conjunction with the following drawing figures, wherein like numerals denote like elements.

DETAILED DESCRIPTION

The following detailed description is merely exemplary in nature and is not intended to limit the disclosure or the application and uses of the disclosure. Furthermore, there is no intention to be bound by any theory presented in the preceding background or the following detailed description.

Existing plasma processing systems are optionally configurable to apply multiple frequencies to a plasma processing chamber because this enables fine control of ion species in the chamber, and thus an improved control over the plasma process (such as plasma etch, or plasma deposition). For example, conventional multiple frequency plasma processing can apply narrowband frequencies at 2 MHz, 13.56 MHz, 27.12 Mhz, 60 MHz, or a broadband signal with a customized spectrum over a wider frequency range. An individual (standalone) radio-frequency (RF) generator is conventionally provided for each frequency channel to be applied to the plasma processing chamber.

Figure 1:
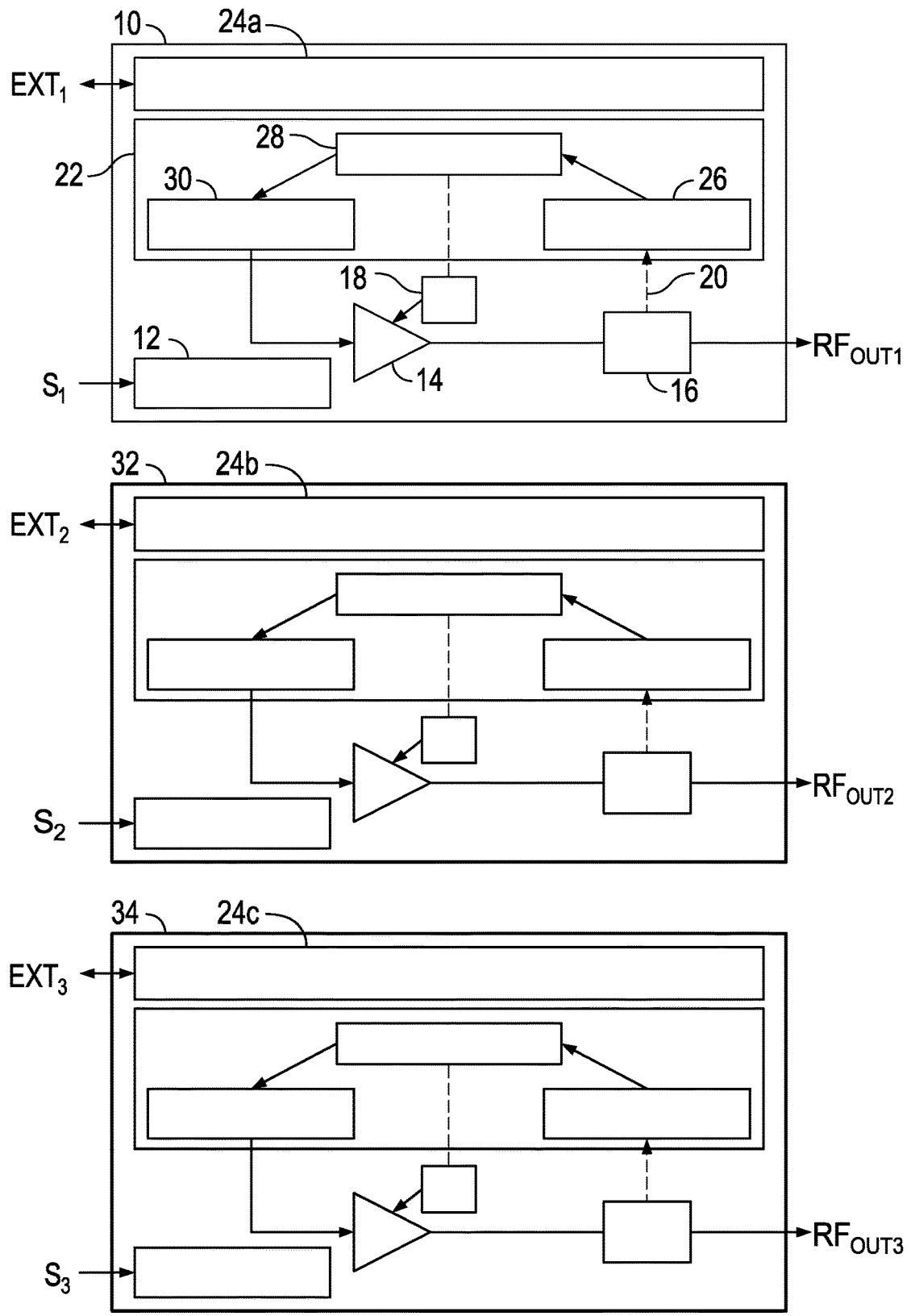
FIG. 1 is a block diagram of a conventional generator system comprising a plurality of standalone generators.

FIG. 1 illustrates a conventional multi-frequency supply arrangement comprising a first 10, second 32, and third 34 conventional RF generator. The first conventional RF generator 10 comprises an external communication interface $EXT_1$, an AC supply interface $S_1$ and an RF output interface $RF_{OUT1}$.

The external communication interface $EXT_1$ is optionally bidirectional or unidirectional, and is configured, for example, to receive control signals from a control system of a plasma process (not shown) for adjusting the configuration of the first conventional RF generator 10, and optionally for transmitting parameter feedback of the first RF generator back to the control system. The supply interface $S_1$ is connected to the mains, for example 230 Volts AC. Such AC input circuitry 12 can comprise rectifiers and other circuits to transform the AC mains into a stabilized DC supply voltage. In the following, the term "AC circuit" will describe such AC input circuitry 12 which is well-known to those skilled in the art. The resulting stabilized DC supply voltage can then be used by various elements of the RF generator, in particular by the amplifiers. The RF output interface $RF_{OUT1}$ enables the transmission of RF power to a plasma reaction chamber, for example via a high-power 50 Ohm transmission line connected to an N-type connector.

In particular, the external communication interface $EXT_1$ is configured to use one of the industrial equipment control standards such as RS232, "PROFIBUS" (™) "CANBUS" (™) or "FIELDBUS" (™), or optionally may be configured to use a proprietary digital or analogue control standard, Ethernet, or the like. The first conventional RF generator 10 thus comprises an external communication interface circuit 24a configured to receive the signal $EXT_1$ and to use the signal to configure the first conventional RF generator 10.

The first conventional RF generator 10 comprises controller 22 having a signal generator 30 configured to generate an RF signal (small signal with low power) at a frequency useful in, for example, a semiconductor plasma deposition or etch process. The signal generator 30 is provided as an analogue or digital oscillator, optionally incorporating a phase-locked loop to enhance stability, and/or a broadband signal source. The output of the signal generator is provided to a first power amplifier 14 capable of amplifying the small signal to a high power level useful in plasma processing. The output of the first power amplifier 14 is connected to the first RF output $RF_{OUT1}$. The first power amplifier 14 is capable of amplifying the small signal into an RF power signal in the range of 50 W to 1000 W, for example. Optionally, the first power amplifier 14 has variable gain.

The output of the first power amplifier 14 is connected to a first pickup module 16 capable of monitoring the signal amplitude and/or current at the output of the first power amplifier 14. For example, the pickup module 16 is a directional coupler, or a voltage-current probe. It basically picks signal information in order to sample the output of the first power amplifier 14. The output 20 of the pickup module 16 is provided to a measurement unit 26 also provided in the controller 22. The measurement unit 26 is therefore able to monitor voltage and/or current level at the output of the first power amplifier 14 and feeds the monitored signal into a regulation module 28.

The regulation module 28 is a digital and/or analogue circuit capable of calculating, based on the monitored signal, whether or not a change should be made to the controller 22 of the first conventional RF generator 10. For example, the regulation module 28 may adjust the frequency, amplitude, phase shift, or optional filter characteristics of the radio-frequency signal generation module 30. Additionally, the regulation module 28 may adjust the gain 18 of the first power amplifier, for example.

FIG. 1 illustrates a further two RF generators 32 and 34. These RF generators may be of the same design or model, or a different design or model. However, the further RF generators in the illustrated conventional case are provided as entirely separate, standalone RF generators. In other words, generator 10 is in a separate enclosure, such as a separate rack-mount unit, to generator 32 and generator 34. The generators are connected to supply interfaces $S_2$ and $S_3$. Furthermore, the first RF generator 10 has external interface 24a. The second RF generator has an external interface 24b. The third RF generator has an external interface 24c.

The RF generators 10, 32, and 34 may be connected to the same control system via their respective external interfaces 24a, 24b, 24c. However, a skilled person will appreciate that owing to inbuilt timing constraints caused by the addressing or contention requirements in interface systems such as "PROFIBUS" (™), significant latency and time synchronization issues can occur between the three RF generators that cause problems in the context of a plasma processing system because the communication protocol would necessitate times of the order of a few ms (few thousandths of a second) to about 0.1 s.

An example of the problem is that of controlling and addressing arc events which can occur in the plasma that is excited using multiple power supplies. An arc event typically occurs on a time-scale much shorter than ms. If a regulation module 28 of a first RF generator 10 detects an arc event and takes remedial action (such as by varying the amplitude of the signal $RF_{OUT1}$ by adjusting the gain of the first power amplifier 14 or by adjusting the signal from the radio-frequency signal generation module 30, there will not be enough time to communicate to the second 32 and third 34 RF generators via the external interfaces $EXT_2$ and $EXT_3$, leading to a lack of coordination in handling arc events.

Furthermore, the co-location of many different separate RF generators in multi-frequency RF generator systems still leads to a duplication of AC input circuitry, external input interface circuitry, housing and cooling systems, and the like.

Figure 2:
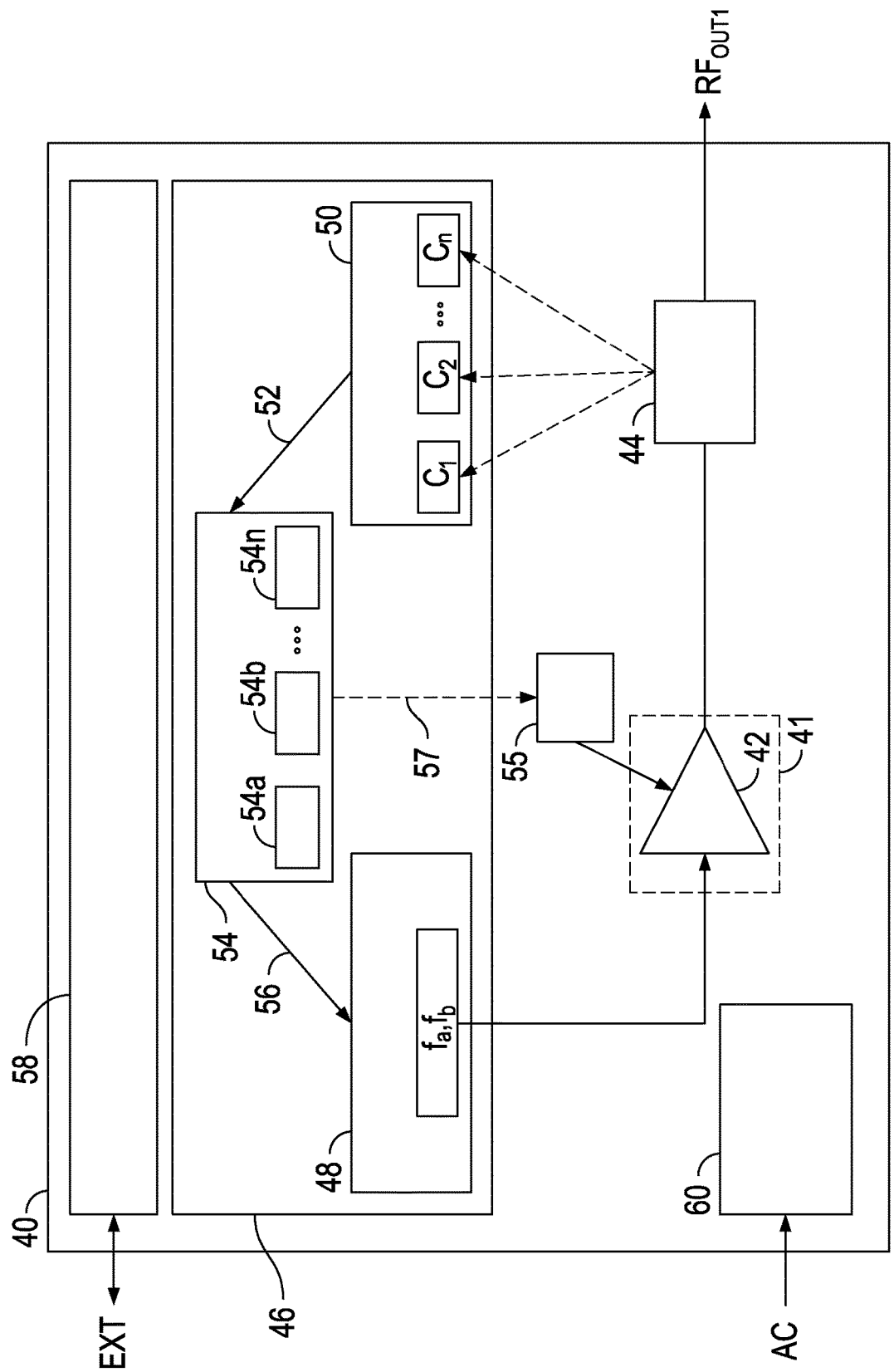
FIG. 2 is a block diagram of a generator having a power amplifier in accordance with various embodiments.

FIG. 2 illustrates an RF generator according to a first aspect.

It is therefore proposed, according to a first aspect, to provide a radio-frequency generator 40 as illustrated in FIG. 2, comprising a power amplifier module 41 comprising at least one power amplifier 42. The radio-frequency generator also comprises at least one pickup module 44 connected to an output of the at least one power amplifier 42 of the power amplifier module 41, at least one RF output RFOUT1 connected to the output of the at least one amplifier 42 configured to output at least one radio frequency power signal, and a controller 46 comprising a radio-frequency generation module 48 configured to generate two or more carrier signals comprising a plurality of frequencies and to provide a drive signal based on these carrier signals to the power amplifier 42 to be amplified into the at least one RF power signal. The controller also comprises a measurement module 50 configured to receive the at least one pickup signal from the pickup module 44 and to generate at least one measurement signal 52 based on the at least one pickup signal and further comprises a regulation module 54 configured to receive the at least one measurement signal from the measurement module, and to regulate the power of the radio-frequency output signal. The controller 46 is configured to adjust the radio-frequency generation module so that it generates carrier signals to drive the power amplifier 42. Preferably, the at least one power amplifier 42 is a multiband power amplifier. Preferably, the at least one power amplifier 42 is a broadband power amplifier.

The generator comprises an AC input circuit 60 and an external communications interface circuit 58. In an embodiment of FIG. 2, the power amplifier 42 is a broadband, or multiband power amplifier, and the radio-frequency signal generation module 48 is configured to generate a plurality n of carrier signal frequencies and to provide a drive signal to the power amplifier 42 by arithmetically combining the n carrier signals. In other words, instead of providing RF power at n different frequencies using n different standalone units, the n RF frequencies are provided using one standalone unit. Monitoring the amplified RF (power) signal comprising n frequency components provided at the output of the power amplifier 42 to the RF output RFOUT1 of the RF generator is performed by the pickup module 44 (for example, the pickup module comprises a sufficient number (up to n) of sampling elements (elements such as V/I probes and directional couplers) to pick up the characteristics of the power RF signal. These pickup signals are fed to the measurement module 50 described earlier. This modus operandi allows for control loops in the generation of RF power signals provided at the output of the RF power generator and these control loops are used to optimize the output characteristics of the RF power signal. When the electrical characteristics of the load changes (which is very common for example in plasma processing), then the output of the radio-frequency generator must be optimized in real-time (or at least with the slightest delay possible).

Advantageously, if a fault condition (such as an arc condition) is detected by the measurement module 50, the regulation module 54 is able to adjust the affected frequency components (for example, to make the carrier signal with corresponding frequency f1 smaller in amplitude). Because all frequency components are monitored by the same controller 46, a reaction time for suppressing a fault condition (such as an arc) is much lower when using carrier signals of a same controller compared to the reaction time possible when communicating over n external interfaces (such as Profibus (™)). In other words, a fault condition in the application of the RF generator may be suppressed without lengthy communication over an external interface.

Preferably, the measurement module 50 comprises an arc detector (not illustrated). The arc detector may monitor one or more pickup signals to determine an arc condition. For example, an arc condition may be detected by comparing the RF current and voltage at the pickup module 44 with an expected condition in an operation mode of the RF generator. Optionally, an arc condition may be detected using signal processing of one or more signals of the pickup modules. Optionally, one or more pickup modules may be installed to monitor the forward and/or reflected power.

Preferably, such an arc detector can be implemented in fast custom logic such as an FPGA (field programmable gate array) or a real-time processor with fast interrupts. Optionally, the arc detector is a fast analogue circuit.

Thus, an embodiment concerns at least a common control circuit generating a plurality of carrier signals and providing a drive signal based thereupon to drive at least one RF amplifier 42. The drive signal can consist of at least two carrier signals (2 frequency components) or more than two carrier signals or an arithmetic operation of two or more carrier signals. Together with the multi-pickup measurement system, this enables the implementation of multiple control loops to optimize the RF power signal provided at the output of the RF generator.

Preferably, one or more power amplifiers may advantageously be implemented as multiband power amplifiers.

Preferably, one or more power amplifiers may advantageously be implemented as a broadband power amplifier.

Preferably, the power amplifiers may be supplied by a common DC voltage supply.

Preferably, the power amplifiers may be supplied by different DC voltage supplies obtained from a common AC supply circuit 60 connected to the mains.

Preferably, auxiliary circuit components such as a circuit breaker, connectors, and/or an external communication interface 58 can be shared by the measurement module, the radio-frequency generation module 48 and the regulation module 54 via the single controller 46

Preferably, the regulation module 54 comprises a plurality of control elements 54a, 54b, 54c. A first control element 54a is configured to receive a measurement signal 52 having a signal component at frequency f1 picked-up from the RF output via the pickup module 44. The first control element compares the signal component at frequency f1 with an expected value or value range. If the condition (magnitude, phase shift, frequency offset, harmonic content, rate of change) of the measurement signal 52 is expected, then the first control element does not regulate (does not modify) the corresponding carrier signal (with frequency f1) provided by the radio-frequency generation module 48. If the condition of the first measurement signal 52 is not expected, then the first control element regulates the radio-frequency generation module 48 by changing the corresponding carrier signal with frequency f1. The change may be a variation in magnitude, phase, or a frequency offset, for example.

In other words, a loop from pickup module 44 via measurement module 50, regulation module 54, radio-frequency signal generation module 48 and first power amplifier 42 forms a control loop for a first frequency of the radio-frequency power generator. The control loop of the controller 46 may be implemented as a digital processing element such as a microcontroller, a digital signal processor, and/or an FPGA or other programmable logic, and the like, or an analogue control circuit.

Preferably, the control loop of the regulation module functions, for example, to identify a transient fault condition (such as an arcing condition in a semiconductor processing chamber) picked up with pickup module 44 at a first frequency f1, and to regulate a carrier signal with corresponding frequency f1 which, as explained earlier, contributes to the drive signal for the first power amplifier 42. This feedback loop allows implementing measures to counteract the transient fault condition, for example by reducing the output power.

Preferably, the controller 46 comprises a second control element 54b to identify and correct a second transient fault condition at a second frequency f2. There is no restriction on the number of fault conditions that may be identified. FIG. 2 illustrates a discrete number of control elements 54a, 54b, 54c to detect and address fault conditions at different frequencies. In FIG. 2 the power amplifier module 41 comprises only one power amplifier 42 and in that example, only 2 carrier signals are being generated by the radio-frequency signal generation module. This embodiment is especially advantageous to provide an inexpensive dual frequency radio-frequency power generator using one single controller, and one single power amplifier (which can be multiband). The power RF signal at the output of the radio-frequency generator $RF_{OUT1}$ is basically made of two contributions at the two different frequencies.

Preferably, the controller 46 is configured to adjust the output power of the radio-frequency output of the first power amplifier 42 by adjusting the carrier signals based on a measurement signal from the measurement module 50. Alternatively or in combination, the controller 46 is configured to adjust the DC voltage supply 55 of the first power amplifier based on a measurement signal from the measurement module. For example, in the case that the measurement module detects a catastrophic fault condition (this could be for example an insulation failure in the power connection cable to the plasma processing chamber, not shown in FIG. 2), the regulation module 54 will regulate the power down to zero quickly by shutting down the DC voltage supply 55 of the power amplifier 42.

A radio-frequency generator according to that illustrated in FIG. 2 is thus able to generate a plurality of carrier signals (two are illustrated fa, fb) and to provide a drive signal to first power amplifier 42 and regulate the power at the output of the generator. Dual-frequency power generators will add a second control knob for plasma processing applications compared to single frequency radio-frequency power generators and are simpler, less expensive and less bulky than using two standalone radio-frequency generators. Moreover, the common controller 46 brings additional control features to plasma processing as it allows faster response to plasma instabilities or to any fault conditions in the electric load.

Figure 3:
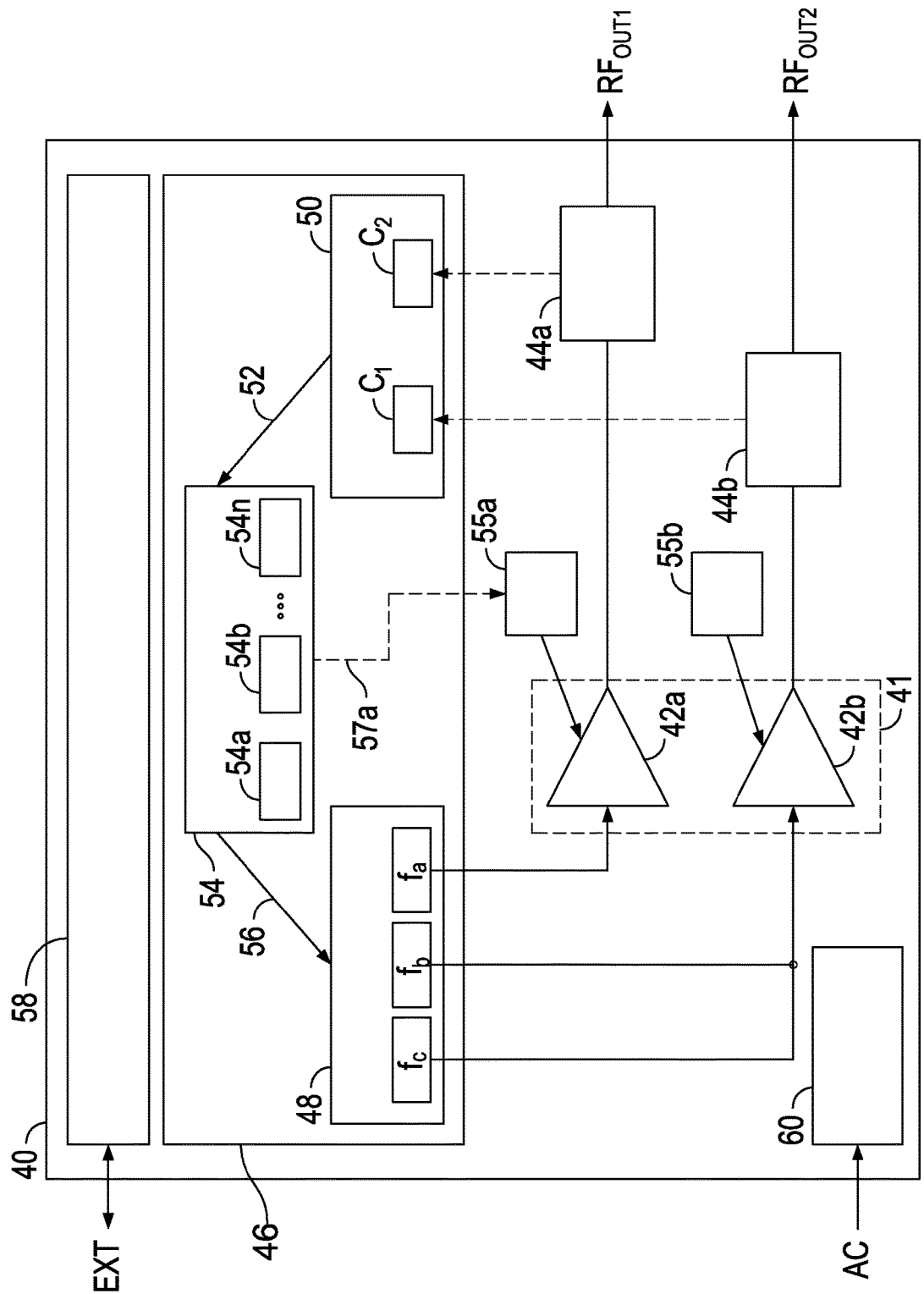
FIG. 3 is a block diagram of a generator having a plurality of power amplifiers according to various embodiments.

FIG. 3 is a block diagram of an embodiment of a radio-frequency generator 40 having a power amplifier module 41 with two power amplifiers 42a and 42b, three carrier signals fa, fb, fc generated by the radio-frequency generation module 48 and two drive signals driving the two power amplifiers (shown by each arrow at the input of power amplifiers 42a and 42b). Note that in the example shown, the signal driving power amplifier 42a is based on one carrier signal fa whereas the signal driving power amplifier 42b is based on two carrier signals fb and fc. Also note that in FIG. 3, features explained in common with those of FIG. 2 have like reference numerals.

The first power amplifier and second power amplifiers can be narrowband power amplifiers or can be a combination of narrowband power amplifier (42a in FIG. 3) and multiband power amplifier (42b in FIG. 3). Pickup module 44a is configured to obtain a representation of the signal at first RF output signal RFOUT1 and to refer the representation to a first channel C1 of the measurement module 50. Pickup module 44b is configured to obtain a representation of the signal at second RF output signal RFOUT2 and to refer the representation to a second channel C2 of the measurement module 50.

Regulation module 54 of controller 46 is configured to receive a measurement signal 52 from the measurement module 50 comprising representations of first and second pickup modules 44a and 44b.

The controller also comprises a measurement module 50 configured to receive the at least one pickup signal from the pickup module 44a and to generate at least one measurement signal 52 based on the at least one pickup signal and further comprises a regulation module 54 configured to receive the at least one measurement signal from the measurement module, and to regulate the power of the radio-frequency output signal. The controller 46 is configured to adjust the radio-frequency generation module by means of signal 56 so that it generates carrier signals fa, fb, fc to provide drive signals to power amplifier 42a and 42b. Preferably, the at least one power amplifier (for example 42b) is a multiband power amplifier. Preferably, the at least one power amplifier (for example 42a) is a broadband power amplifier.

Preferably, the regulation module 54 comprises a plurality of control elements 54a, 54b, 54c. A first control element 54a is configured to receive a measurement signal 52 based on a pickup signal generated by first pickup module 44a. The first control element compares the pickup signal with an expected value or value range. If the condition (magnitude, phase shift, frequency offset, harmonic content, rate of change) of the measurement signal 52 is expected, then the first control element 54a does not regulate (does not modify) the corresponding carrier signal(s)

If the condition of the first measurement signal 52 is not expected, then the first control element regulates the signal generator 48 by changing the corresponding carrier signal fa or carrier signals fb and fc. The change may be a variation in magnitude, phase, or a frequency offset, for example. With a change in carrier signals, the drive signals driving the first power amplifier 42a and/or the second 42b power amplifier will be changed and the output of the RF power RFOUT1 or RFOUT2 is changed. Because RFOUT1 and RFOUT2 correspond to power signals of different frequencies, the RF power generator can be regulated at selected frequencies or over an extended frequency range For example with a combination of multiband power amplifier 42b and narrowband power amplifier 42a, the frequency spectrum and power levels of the radio-frequency generator can be adjusted advantageously.

In an embodiment of FIG. 3, one drive signal comprises two or more narrowband carrier signals fb and fc.

Similar to the manner described with FIG. 2, a control loop can be implemented with the radio-frequency generator of FIG. 3 The control loop of the controller 46 may be implemented as a digital processing element such as a microcontroller, a digital signal processor, and/or a field programmable gate array or other programmable logic, and the like, or an analogue control circuit.

The approach is not limited to the two illustrated power amplifiers, as an even greater number of power amplifiers will provide more options in the output frequency spectrum of the radio-frequency generator. A higher number of power amplifiers will thus allow a finer control (in power and frequency) of the output power for a plasma processing chamber or any other high frequency application.

Figure 4:
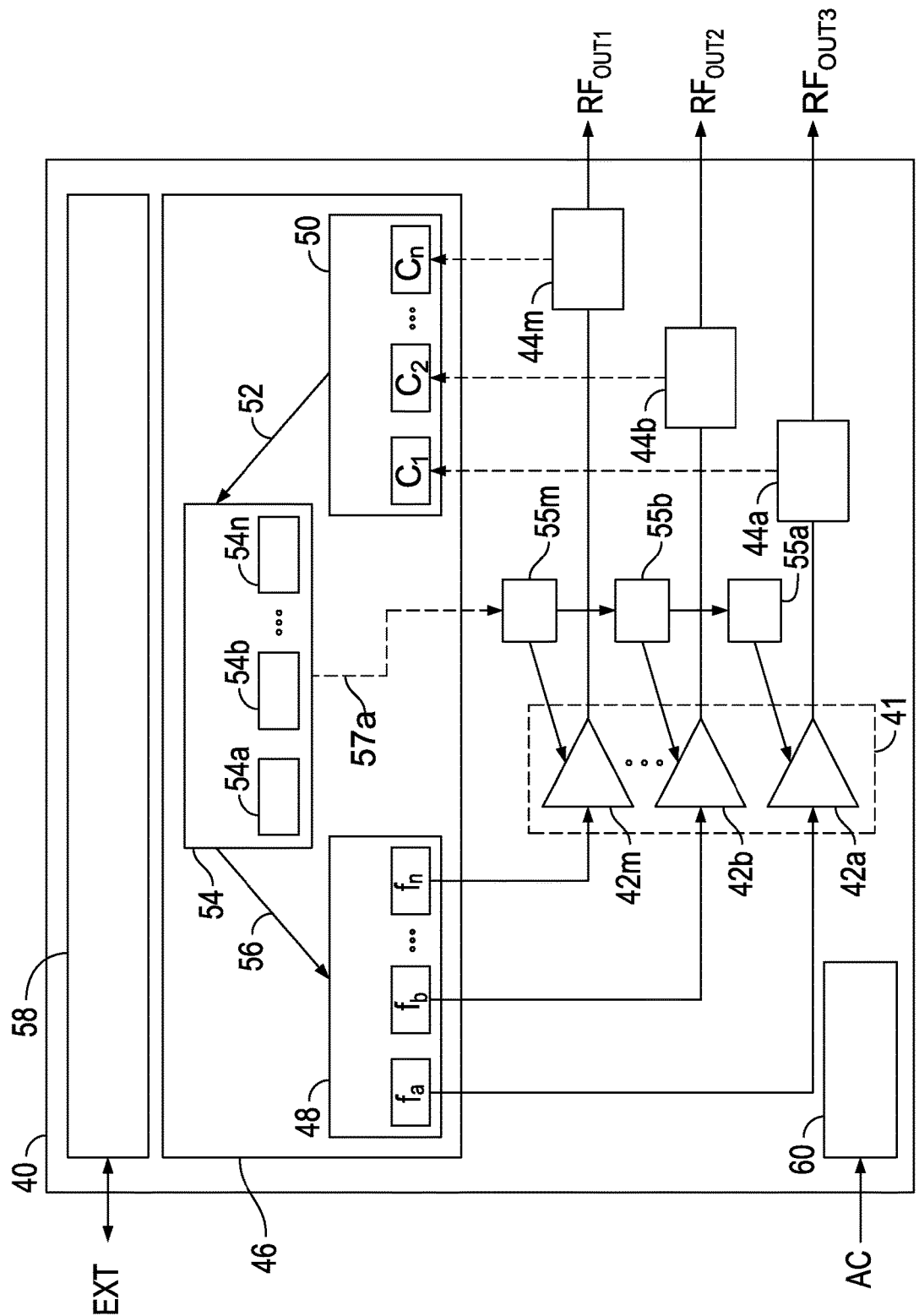
FIG. 4 is a block diagram of a generator having a plurality of power amplifiers according to further various embodiments.

FIG. 4 illustrates a further embodiment of a multi-amplifier RF generator 40. In FIG. 4, features explained in common with those of FIG. 2 or 3 have like reference numerals.

FIG. 4 illustrates an embodiment of a multi-amplifier RF generator 40 comprising a power amplifier module 41 further comprising first 42a, second 42b, and mth 42m power amplifiers. Optionally, one or more of the power amplifiers is a multi-band power amplifier driven by a drive signal comprising two or more carrier signals generated by the radio-frequency generation module 48.

Alternatively, each of the power amplifiers is narrowband and for example, the first power amplifier 42a is optimized for a 13.56 MHz centre frequency, the second power amplifier 42b is optimized for a 27.12 MHz centre frequency, and the third power amplifier is optimized for a 60 MHz centre frequency. Such frequency values are indicative and a skilled person would be able to use different ones for a different RF generator application.

In the embodiment of FIG. 4, each power amplifier is supplied by an individual DC power supply 55a, 55b, . . . , 55m respectively. Alternatively, one or more of the power amplifiers are supplied from a shared DC power supply.

In embodiments discussed above where the controller 46 is implemented as a digital processing element such as a microcontroller, or a digital signal processor, and/or a field programmable gate array or other programmable logic, and the like, computer code or a field programmable gate array logic definition may be used to define the processing performed by the control unit. The computer code is loaded into the respective digital processing element upon activation of the RF generator so that the controller is configured to perform the control functions discussed above.

The signal generator 48 of the controller 46 discussed in the above embodiments may generate signals natively. Alternatively, the signal generator 48 may be connected to one or more analogue signal generator circuits (not shown) such that the signal generator 48 controls the analogue signal generators.

Thus, according to a fourth aspect there is provided a computer program element for controlling the controller 46.

According to a fifth aspect, there is provided a computer readable medium comprising the computer program element of the fourth aspect.

Generally, embodiments described above concern an RF generator having one controller 46 with a radio-frequency signal generation module 48 generating two or more (up to n) carrier signals distributed to between one amplifier to a number m of amplifiers (m being equal or smaller than n). Each amplified signal is provided at an output of the radio-frequency generator and each is connected to a corresponding pickup module 44 (such as directional coupler, V/I probe). A controller 46 comprises a multi-channel measurement module 50, a radio-frequency generation module 48 and a regulation module 54 to regulate power of multiple power amplifiers by means of generating carrier signals to drive the individual power amplifiers. Control loops are implemented to provide optimum power and frequency spectrum at the output of the radio-frequency generator.

Each signal is defined in frequency, amplitude, and phase. The power amplifiers can refer to narrowband, multi, or broadband amplifiers.

Each power amplifier 44 can be supplied with an individual DC voltage supply 55, or share a DC voltage supply with a subset of power amplifiers, enabling a saving in the number of DC voltage supplies required, and a fortiori the number of AC circuits (required) to obtain DC voltage supplies from the AC mains.

Preferably, the control of the output power of the power amplifiers is achieved by (i) control of the DC voltage powering each power amplifier, (ii) control of the carrier signals used to drive each power amplifier in frequency, phase and/or amplitude, or (iii) both of (i) and (ii) combined.

In summary, the combinations of the embodiments include at least the following optional cases provided only for exemplary purposes:

A radio-frequency generator in which at least first and second drive signals are narrowband signals and can therefore be generated using individual carrier signals generated by the radio-frequency generation module of the controller of the radio-frequency generator.

A radio-frequency generator in which one drive signal is provided to one power amplifier with the drive signal being an arithmetic combination of two carrier signals generated by the radio-frequency generation module of the controller of the radio-frequency generator.

A radio-frequency generator in which the drive signal provides a broadband signal made of various carrier signals over a wide frequency range to be amplified by a broadband power amplifier of the power amplifier module.

A radio-frequency generator in which a first narrowband drive signal is amplified by a first narrowband power amplifier, and a second multiband drive signal is amplified by a second multiband power amplifier.

A radio-frequency generator in which a first narrowband drive signal is amplified in a first narrowband power amplifier channel, and a second broadband drive signal is amplified by a second broadband amplifier.

A radio-frequency generator in which a first multiband drive signal, a second broadband drive signal, and a third narrowband drive signal are amplified as follows: the first multiband drive signal is amplified by a first multiband amplifier. The second broadband drive signal is amplified by a broadband amplifier, the third narrowband drive signal is amplified in a third narrowband amplifier.

The generator may combine the outputs in many different ways. For example, the generator may be configured to apply two narrowband RF power signals to a combined output simultaneously. Alternatively, the generator may be configured to alternate the application of narrowband power signals.

Figure 5:
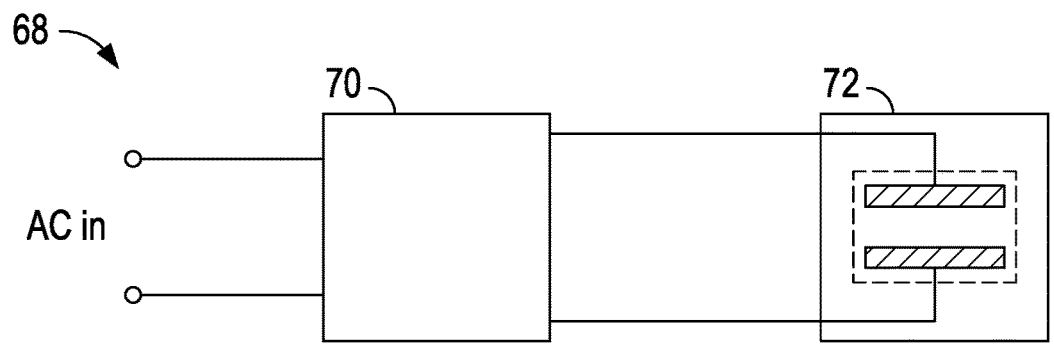
FIG. 5 is a block diagram of a plasma processing system according to the second aspect.

FIG. 5 illustrates a plasma processing system 68 comprising a generator 70 according to the embodiments discussed above, and a semiconductor processing module 72 configured to receive two or more RF signals from the generator.

The semiconductor processing module comprises a plasma chamber 72 for plasma processing (plasma etch, or plasma deposition) of, for example, a silicon wafer. Thus, the plasma chamber is a gas-tight module capable of containing a processing gas in the vicinity of a silicon wafer. The plasma chamber is typically provided with a sealable aperture capable of mating with a wafer transport system. First and second electrodes are provided at appropriate locations. The first and second electrodes are connected to the generator 70. The generator is connected to the RF generator via a high-power coaxial connector, for example. The high-power RF signal induces a rapidly varying electric field in-between the first and second electrodes, which in the presence of an appropriate process gas enables a processing plasma to be formed.

Figure 6:
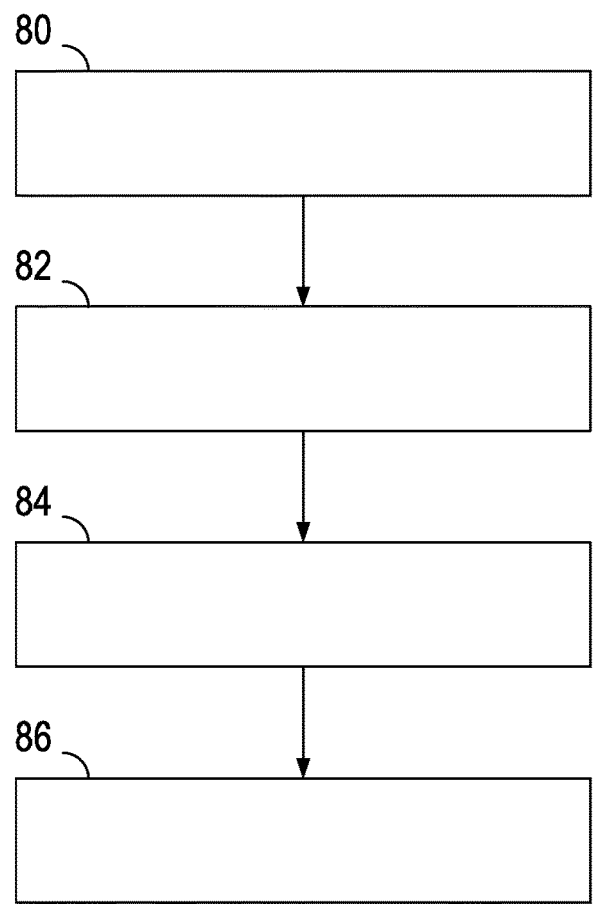
FIG. 6 is a block diagram of a method according to the third aspect.

FIG. 6 illustrates a method for operating a generator controller according to the third aspect. The method comprises:
  generating 80, at least two carrier signals of different frequency using a radio-frequency generation module and providing at least one drive signal for a power amplifier module.
  measuring 82 at least one radio-frequency output signal, using a measurement module of the controller configured to receive at least one pickup signal from at least one pickup module and generating at least one measurement signal based on the at least one pickup signal.
  regulating 84 the power of at least one radio-frequency output signal, using a regulation module configured to receive the at least one measurement signal from the measurement module.

Preferably, the regulation module of the controller receives at least one measurement signal from the measurement module of the controller and adjusts the radio-frequency signal generation module to change the amplitude, phase, and/or frequency of at least one of the two or more carrier signals based on the at least one measurement signal.

Preferably, the controller receives at least one measurement signal from the measurement module, and adjusts the gain of the at least one power amplifier based on the at least one measurement signal.

Preferably, the controller receives at least one measurement signal from the measurement module and adjusts a DC supply voltage of the at least one power amplifier.

Preferably, the radio-frequency signal generation module is further configured to generate the two or more carrier signals and provide a multi-carrier drive signal to at least one power amplifier that is a multiband or broadband power amplifier.

Preferably, the power amplifier module further comprises a total number of power amplifiers corresponding to a total number of RF outputs of the generator.

Preferably, the at least one power amplifier is a broadband power amplifier, and the second power amplifier is a narrowband power amplifier, and the radio-frequency signal generation module generates multiple carrier signals and multiple drive signals of these carrier signals, wherein at least one drive signal is multi-carrier and at least one drive signal is single carrier.

Preferably, the at least one and the second power amplifier share a common supply voltage.

Preferably, the at least one and the second power amplifier are powered by first and second supply voltages, respectively.

Preferably, an external interface of the generator outputs data comprising values obtained by the at least one pickup module.

Preferably, the controller controls the time synchronization between at least two of the carrier signals.

In particular the two phases of two RF power signals provided at at least two RF outputs can be phase-locked Preferably, the controller controls the frequency synchronization between at least two of the carrier signals.

Preferably, the controller detects a fault event with the first pickup module and adjusts the power of the first RF output signal based on the detection of the fault event.

Preferably, the fault event is an arc event in a plasma system.

While at least one exemplary aspect has been presented in the foregoing detailed description of the disclosure, it should be appreciated that a vast number of variations exist. In particular, a power amplifier can be considered to comprise a single amplifier stage, a plurality of amplifiers in series, and/or a plurality of amplifiers in parallel. It should also be appreciated that the exemplary aspect or exemplary aspects are only examples, and are not intended to limit the scope, applicability, or configuration of the disclosure in any way. Rather, the foregoing detailed description will provide those skilled in the art with a convenient road map for implementing an exemplary aspect of the disclosure. It being understood that various changes may be made in the function and arrangement of elements described in an exemplary aspect without departing from the scope of the disclosure as set forth in the appended claims.

What is claimed is:

1. A radio-frequency generator, comprising:
  a power amplifier module comprising at least one power amplifier;
  at least one pickup module connected to an output of the at least one power amplifier to generate at least one pickup signal;
  at least one output configured to be connected to the respective output of the at least one amplifier and configured to output at least one radio-frequency output signal; and
  a controller comprising:
    a measurement module configured to receive the at least one pickup signal and to generate at least one measurement signal based on the at least one pickup signal; and
    a radio-frequency signal generation module configured to generate two or more carrier signals of different frequency, and to provide at least one drive signal as input to the power amplifier module;
a regulation module configured to receive the at least one measurement signal, and to regulate the power of the at least one radio-frequency output signal based on the at least one measurement signal, wherein the controller is configured to regulate the power of the at least one radio-frequency output signal by adjusting the amplitude and/or phase of at least one of the two or more carrier signals based on the measurement signal.

2. The radio-frequency generator according to claim 1, wherein the power amplifier module further comprises at least a second power amplifier.

3. The radio-frequency generator according to claim 2, wherein the regulation module is configured to operate with at least two independent regulation loops.

4. The radio-frequency generator according to claim 2, wherein at least two power amplifiers of the power amplifier module are configured to be operated with a common DC supply voltage.

5. The radio-frequency generator according to claim 2, wherein the at least two power amplifiers of the power amplifier module are configured to be operated with separate DC supply voltages.

6. The radio-frequency generator according to claim 1, wherein the power amplifier module, the at least one pickup module and the controller are implemented within a common enclosure.

7. The radio-frequency generator according to claim 2, further comprising a first enclosure and a second enclosure physically separate from the first enclosure, wherein the first enclosure comprises a first of the at least two power amplifiers, and the second enclosure comprises a second of the at least two power amplifiers.

8. The radio-frequency generator according to claim 1, wherein the controller is further configured to adjust a DC supply voltage of at least one power amplifier of the power amplifier module.

9. The radio-frequency generator according to claim 1, wherein the number of carrier signals generated in the radio-frequency signal generation module corresponds to the number of outputs of the radio-frequency generator.

10. The radio-frequency generator according to claim 1, wherein the number of carrier signals generated in the radio-frequency signal generation module corresponds to the number of pickup modules.

11. The radio-frequency generator according to claim 1, wherein the number of carrier signals generated in the radio-frequency signal generation module corresponds to the number of power amplifiers in the power amplifier module.

12. The radio-frequency generator according to claim 1, wherein at least one power amplifier of the power amplifier module is a broadband or multiband power amplifier configured to be driven with a multi-carrier drive signal composed of at least two carriers generated by the radio-frequency signal generation module.

13. The radio-frequency generator according to claim 1, wherein the controller further comprises means for synchronization of phases of the two or more carrier signals.

14. The radio-frequency generator according to claim 1, further comprising an external interface for synchronization of the radio-frequency output power at the at least one output of the radio-frequency generator with other DC and/or other medium-frequency and/or other radio-frequency generators.

15. The radio-frequency generator according to claim 1, further comprising a common AC input circuit.

16. The radio-frequency generator according to claim 1, wherein the at least one radio-frequency output signal has a power of at least 100 W, or at least 200 W, or at least 250 W.

17. The radio-frequency generator according to claim 1, wherein the at least one radio-frequency output signal comprises a frequency in the range 0.1 MHz to 200 MHz.

18. The radio-frequency generator according to claim 1, wherein at least one output of the radio-frequency generator is connected to a plasma processing system.

19. The radio-frequency generator according to claim 1, wherein the controller is configured to detect a fault event in at least one of the RF outputs, and to adjust one or more of the output signals based on the detection of the fault event in the pickup module.

20. The radio-frequency generator according to claim 19, wherein the fault event is an arcing event.

21. A plasma processing system comprising:
a radio-frequency generator according to claim 1, and
a semiconductor processing tool configured to receive an RF output signal from the radio-frequency generator.

22. A radio-frequency generator, comprising:
a power amplifier module comprising at least one power amplifier;
at least one pickup module connected to an output of the at least one power amplifier to generate at least one pickup signal;
at least one output configured to be connected to the respective output of the at least one amplifier and configured to output at least one radio-frequency output signal; and
a controller comprising:
a measurement module configured to receive the at least one pickup signal and to generate at least one measurement signal based on the at least one pickup signal; and
a radio-frequency signal generation module configured to generate two or more carrier signals of different frequency, and to provide at least one drive signal as input to the power amplifier module;
a regulation module configured to receive the at least one measurement signal, and to regulate the power of the at least one radio-frequency output signal based on the at least one measurement signal, wherein the regulation module is configured to regulate the power of the at least one radio-frequency output signal by adjusting the amplitude/or phase of two or more carrier signals generated by the radio-frequency signal generation module.

23. A method for operating a radio-frequency generator controller, comprising:
generating at least two carrier signals of different frequency using a radio-frequency generation module and providing at least one drive signal for a power amplifier module;
measuring at least one radio-frequency output signal, using a measurement module of the controller configured to receive at least one pickup signal from at least one pickup module and generating at least one measurement signal based on the at least one pickup signal;
regulating the power of at least one radio-frequency output signal, using a regulation module configured to receive the at least one measurement signal from the measurement module, wherein the power of the at least one radio-frequency output signal is regulated by adjusting the amplitude and/or phase of at least one of the two or more carrier signals based on the measurement signal.

24. A computer program element comprising instructions which, when executed by a processor, carry out the method of claim 23.

25. A computer readable medium comprising the computer program element of claim 24.

* * * * *